(12) United States Patent
Ojima

(10) Patent No.: US 6,611,182 B2
(45) Date of Patent: Aug. 26, 2003

(54) PIEZOELECTRIC FILTER WITH DECREASED ADHESIVE LAYER THICKNESS AND MODULUS OF ELASTICITY AND MANUFACTURING METHOD THEREFOR

(75) Inventor: Shigeo Ojima, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/861,754

(22) Filed: May 21, 2001

(65) Prior Publication Data

US 2002/0014933 A1 Feb. 7, 2002

(30) Foreign Application Priority Data

Jun. 27, 2000 (JP) .................................... 2000-193296

(51) Int. Cl.[7] .............................. H03H 9/58; H03H 9/60
(52) U.S. Cl. ........................ 333/189; 333/192; 29/25.35
(58) Field of Search ........................... 333/186–192; 29/25.35

(56) References Cited

U.S. PATENT DOCUMENTS 5,933,061 A * 8/1999 Takamoro et al. .......... 333/189
6,002,308 A * 12/1999 Gamo ......................... 333/187
6,011,451 A * 1/2000 Gamo ......................... 333/189
6,274,969 B1 * 8/2001 Gamo ......................... 310/366
6,359,532 B1 * 3/2002 Sugiyama et al. ........... 333/189

FOREIGN PATENT DOCUMENTS

| JP | 63-107307 A | 5/1988 |
|---|---|---|
| JP | 4-178420 A | 6/1992 |
| JP | 10-135769 | 5/1998 |
| JP | 10-163793 | * 6/1998 |
| JP | 10-284985 A | 10/1998 |
| JP | 10-335976 | 12/1998 |
| JP | 11-68509 | 3/1999 |
| JP | 2000-341075 | * 12/2000 |

* cited by examiner

Primary Examiner—Barbara Summons
(74) Attorney, Agent, or Firm—Keating & Bennett, LLP

(57) ABSTRACT

An energy-trap piezoelectric filter has a construction such that first and second piezoelectric substrates are laminated with an adhesive sheet therebetween. The elasticity modulus of the adhesive sheet is within the range of about 0.5 MPa to about 3000 MPa. In addition, the adhesive sheet is provided with at least one notch in which a material that is used to form external electrodes is inserted.

20 Claims, 4 Drawing Sheets

PIEZOELECTRIC FILTER WITH DECREASED ADHESIVE LAYER THICKNESS AND MODULUS OF ELASTICITY AND MANUFACTURING METHOD THEREFOR

BACKGROUND OF THE INVENTION

1. Field of the Invention

The present invention relates to chip-type piezoelectric filters for use as band-pass filters, and also relates to manufacturing methods therefor. More particularly, the present invention relates to a piezoelectric filter having a construction such that a plurality of piezoelectric substrates having energy-trap filter units disposed thereon, are laminated with adhesive layers disposed therebetween, and to a method of manufacturing such a piezoelectric filer.

2. Description of the Related Art

Conventionally, various kinds of chip-type piezoelectric filters having a construction such that a plurality of piezoelectric substrates, on which piezoelectric filter units are constructed, are laminated with adhesive layers therebetween, have been suggested in, for example, Japanese Unexamined Patent Application Publications Nos. 10-335976, 10-135769, 11-68509, among others.

FIG. 5 is an exploded perspective view of an energy-trap piezoelectric filter 101 which is disclosed in Japanese Unexamined Patent Application Publication No. 11-68509.

According to this publication, the energy-trap piezoelectric filter 101 includes a first piezoelectric substrate 102 and a second piezoelectric substrate 103. The first piezoelectric substrate 102 is provided with a first piezoelectric filter unit 104 and a transfer capacitor unit 105, and the second piezoelectric substrate 103 is provided with a second piezoelectric filter unit 106 and a transfer capacitor unit (not shown). The shapes of electrodes disposed on the bottom surface of the first piezoelectric substrate 102 are approximately the same as the shapes of electrodes disposed on the top surface of the second piezoelectric substrate 103. In addition, the shapes of electrodes disposed on the bottom surface of the second piezoelectric substrate 103 are approximately the same as the shapes of the electrodes disposed on the top surface of the first piezoelectric substrate 102.

The first and the second piezoelectric substrates 102 and 103 are laminated with an insulating spacer 107 therebetween, and insulating spacers 108 and 109 are laminated on the outwardly facing surfaces of the piezoelectric substrates 102 and 103, respectively. In addition, case substrates 110 and 111 are laminated on the outwardly facing surfaces of the spacers 108 and 109, respectively. The chip-type piezoelectric filter 101 is formed by laminating the above-described components, and by forming external electrodes on the outwardly facing surfaces of the resulting laminate.

The spacers 107 to 109 have through holes 107a to 109a, respectively, which provide sufficient spaces for the piezoelectric filter units 104 and 106 constructed on the piezoelectric substrates 102 and 103, respectively, to freely vibrate therein. The spacer 107 is provided with notches 107b to 107d at the periphery thereof, and the spacers 108 and 109 are provided with notches 108b and 109b, respectively. These notches 107b to 107d, 108b, and 109b are filled with a conductive material of which the external electrodes are formed. More specifically, the external electrodes are formed by applying the conductive material on the outwardly facing surfaces of the laminate including the above-described components, in a manner such that the conductive material also fills the notches 107b to 107d, 108b, and 109b. Accordingly, the reliability of the electrical connection is improved.

Similar to other electronic components, there is an increasing demand to reduce the size, especially the height, of the conventional chip-type piezoelectric filter shown in FIG. 5.

To realize a reduction in the height, the thicknesses of the spacer 107 disposed between the piezoelectric substrates 102 and 103 and of the spacers 108 and 109 laminated on the outwardly facing surfaces thereof must be reduced. In the conventional chip-type piezoelectric filter 101, however, there is a limit to the amount of reduction in the thicknesses of the spacers 107 to 109 or of an insulating adhesive, which may be used in place of the spacers 107 to 109. Accordingly, it has been difficult to realize a reduction in the height of such components.

SUMMARY OF THE INVENTION

In order to overcome the problems described above, preferred embodiments of the present invention provide an energy-trap piezoelectric filter which is easily made much thinner than conventional devices, and in which the reliability of electrical connection between electrodes is greatly improved and highly reliable. In addition, preferred embodiments of the present invention provide a method of manufacturing the energy-trap piezoelectric filter.

According to a preferred embodiment of the present invention, an energy-trap piezoelectric filter includes a first piezoelectric substrate having a first piezoelectric filter unit and a first transfer capacitor unit, a second piezoelectric substrate having a second piezoelectric filter unit and a second transfer capacitor unit, an adhesive layer which is disposed between the first and the second piezoelectric substrates so that a laminate including the first and the second piezoelectric substrates and the adhesive layer is defined, and a plurality of external electrodes disposed on the outwardly facing surfaces of the laminate. The elasticity modulus of the adhesive layer is preferably in the range of about 0.5 MPa to about 3000 MPa, and the adhesive layer is provided with at least one notch at the edge thereof. In addition, a material of which the external electrodes are formed is inserted into the at least one notch.

The adhesive layer may have a through hole that is arranged to provide a sufficient space for the first and the second piezoelectric filter units to freely vibrate therein.

In addition, the adhesive layer may be constructed of a thermosetting adhesive sheet that is formed in advance.

Preferably, the notch is filled with the material from which the external electrodes are formed.

According to another preferred embodiment of the present invention, a method of manufacturing a piezoelectric filter includes the steps of preparing a first piezoelectric substrate, which includes a first piezoelectric filter unit and a first transfer capacitor unit, and a second piezoelectric substrate, which includes a second piezoelectric filter unit and a second transfer capacitor unit, forming a laminate by laminating the first and the second piezoelectric substrates with an adhesive therebetween, and forming a plurality of external electrodes on the outwardly facing surfaces of the laminate. The elasticity modulus of the adhesive after being cured is preferably in the range of about 0.5 MPa to about 3000 MPa. In addition, the adhesive which is disposed between the first and the second piezoelectric substrates is provided with at least one notch at the edge, and the external electrodes are formed in a manner such that a material from which the external electrodes are formed is inserted into the notch.

A thermosetting adhesive sheet which is formed in advance and which is cured by heat may be used as the adhesive.

Preferably, the thermosetting adhesive sheet is not adhesive at room temperature and becomes adhesive when heat is applied in an adhering process, and does not have fluidity.

In addition, the adhesive may have a through hole that is arranged to provide a sufficient space for the first and the second piezoelectric filter units to freely vibrate therein.

According to the piezoelectric filter of various preferred embodiments of the present invention, the elasticity modulus of the adhesive layer is in the range of about 0.5 MPa to about 3000 MPa. Thus, even when the thickness of the adhesive layer is reduced, undesired spurious responses are effectively suppressed and minimized. Moreover, at least one notch is formed at the edge of the adhesive layer, and the material from which the external electrodes are formed is inserted therein. Accordingly, even when the adhesive layer is thin, the connection area between the side surfaces of the adhesive layer and the external electrodes is greatly increased, and the reliability of the external electrodes is significantly enhanced.

When the adhesive layer has a through hole which provides a sufficient space for the first and the second piezoelectric filter units to freely vibrate, stable filter characteristic are obtained.

In addition, when the adhesive layer is constructed of a thermosetting adhesive sheet which is formed in advance, the first and the second piezoelectric substrates are easily laminated by disposing the adhesive sheet therebetween and by applying heat to cure the adhesive sheet.

In addition, when the notch is filled with the material from which the external electrodes are formed, reliability of the external electrodes is further improved.

According to a method of manufacturing a piezoelectric film of various preferred embodiments of the present invention, the elasticity modulus of the adhesive that is disposed between the first and the second piezoelectric substrates is in the range of about 0.5 MPa to about 3,000 MPa. Thus, even when the thickness of the adhesive layer is reduced, undesired spurious responses are effectively be suppressed. In addition, since at least one notch is formed on the edge of the adhesive, the reliability of the external electrodes is greatly improved by inserting the material from which the external electrodes are formed into the notch.

When the thermosetting adhesive sheet that is formed in advance and is cured by heat is used as the adhesive, productivity is greatly improved because of its handiness in the laminating process.

In addition, when the thermosetting adhesive sheet is not in adhesive state under room temperature and becomes adhesive when heat is applied in the adhering process, and does not have fluidity, the adhesive sheet is easily disposed between the first and the second piezoelectric substrates. Accordingly, the adhesive layer is more reliably formed at a desired position by applying heat.

In addition, when the adhesive sheet has a through hole which provides a sufficient space for the first and the second piezoelectric filter units to freely vibrate therein, stable filter characteristics are obtained by the vibrations of the first and the second filters.

Other features, elements, characteristics and advantages of the present invention will become apparent from the following detailed description of preferred embodiments of the present invention with reference to the attached drawings.

DETAILED DESCRIPTION OF PREFERRED EMBODIMENTS

Preferred embodiments of the present invention will be described below with reference to the accompanying drawings.

Figure 1:
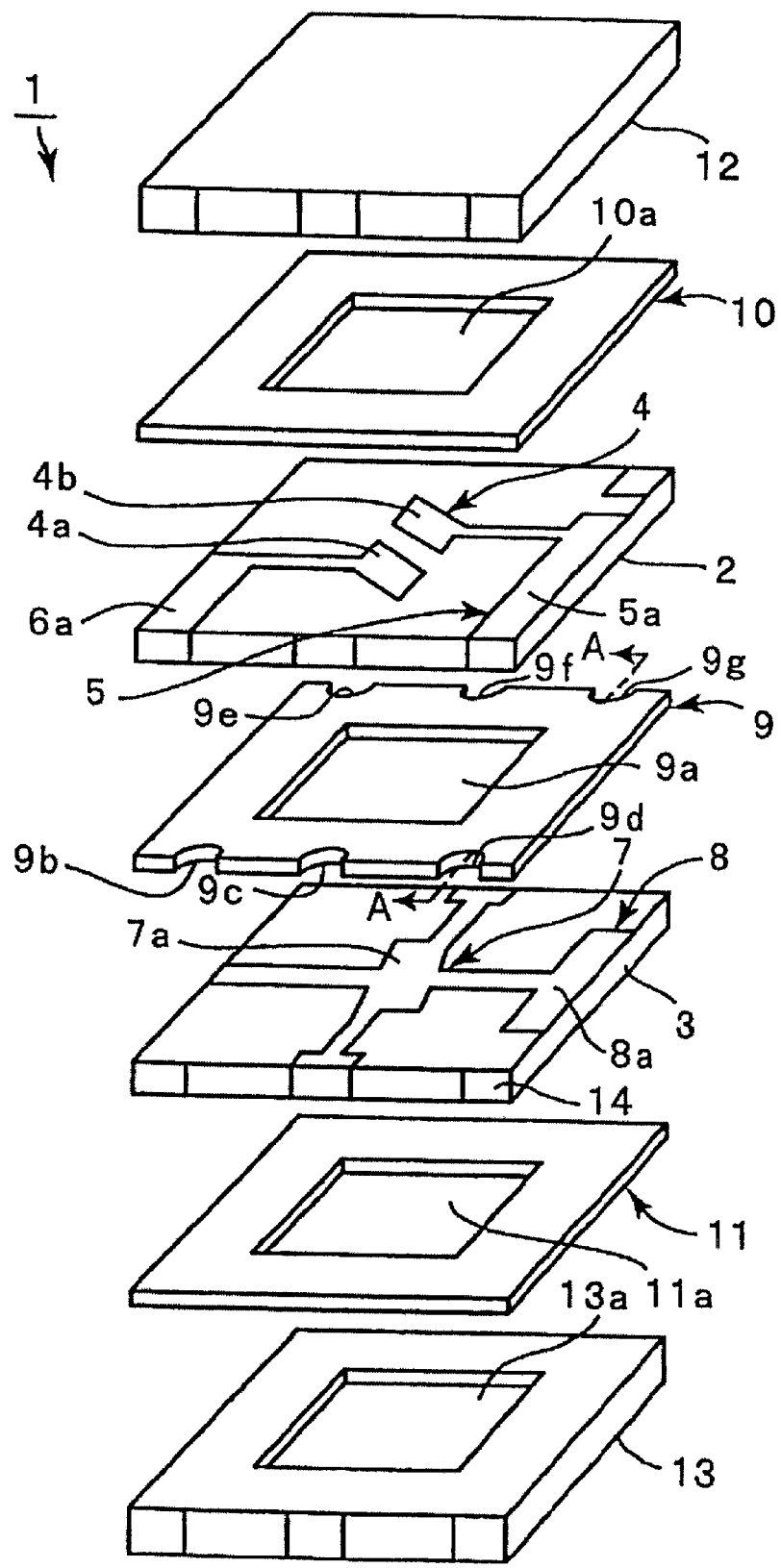
FIG. 1 is an exploded perspective view of a piezoelectric filter according to a preferred embodiment of the present invention.
Figure 2:
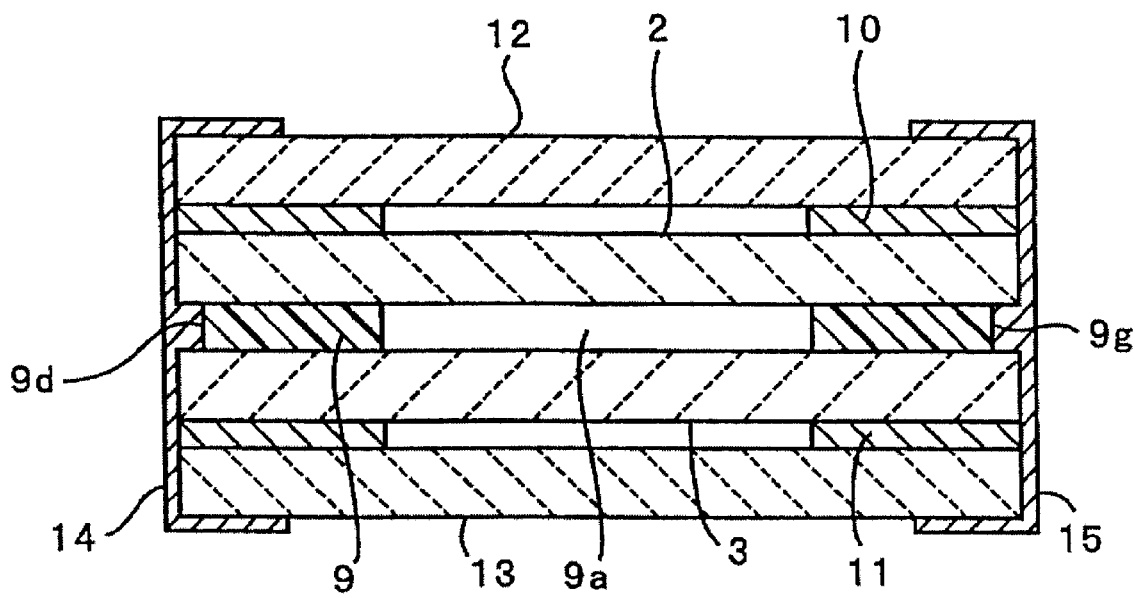
FIG. 2 is a longitudinal sectional view of the piezoelectric filter shown in FIG. 1, which is cut along a plane including line A—A.

FIG. 1 is an exploded perspective view of a chip-type energy-trapping piezoelectric filter 1 according to a preferred embodiment of the present invention, and FIG. 2 is a longitudinal sectional view of the piezoelectric filter 1 shown in FIG. 1.

According to the present preferred embodiment, the piezoelectric filter 1 includes a first piezoelectric substrate 2 and a second piezoelectric substrate 3.

The first piezoelectric substrate 2 is preferably constructed of a piezoelectric ceramic such as a lead zirconate titanate type ceramic, a piezoelectric single crystal such as quartz, or other suitable material, and preferably has a substantially rectangular shape. A first piezoelectric filter unit 4 and a first transfer capacitor unit 5 are disposed on the first piezoelectric substrate 2. The first piezoelectric filter unit 4 includes a pair of resonance electrodes 4a and 4b which are disposed on the top surface of the first piezoelectric substrate 2 at the approximate center thereof. In addition, the first piezoelectric filter unit 4 also includes another resonance electrode which is disposed on the bottom surface thereof at the approximate center so as to oppose both of the resonance electrodes 4a and 4b.

The resonance electrode 4a is connected to a lead electrode 6a, and the resonance electrode 4b is connected to a capacitor electrode 5a which is included in the first transfer capacitor unit 5, and which is arranged so as to extend along an edge of the first piezoelectric substrate 2. The shapes of electrodes disposed on the bottom surface of the first piezoelectric substrate 2 are preferably substantially the same as the shapes of electrodes disposed on the top surface of the second piezoelectric substrate 3. In addition, the shapes of electrodes disposed on the bottom surface of the second piezoelectric substrate 3 are preferably substantially the same as the shapes of the electrodes disposed on the top surface of the first piezoelectric substrate 2.

A second piezoelectric filter unit 7 and a second transfer capacitor unit 8 are provided on the second piezoelectric substrate 3. The second piezoelectric filter unit 7 includes a resonance electrode 7a that is disposed on the top surface thereof. In addition, a pair of resonance electrodes (not shown), which are similar to the resonance electrodes 4a and 4b, are arranged on the bottom surface of the second piezoelectric plate 3 so as to oppose the resonance electrode 7a.

The second transfer capacitor unit 8 includes a capacitor electrode 8a that is connected to the resonance electrode 7a. In addition, another capacitor electrode (not shown), which is similar to the capacitor electrode 5a disposed on the top surface of the first piezoelectric substrate 2, is provided on the bottom surface of the second piezoelectric substrate 3. Accordingly, the capacitor electrode 8a and the other capacitor electrode disposed on the bottom surface of the second piezoelectric substrate 3 oppose each other via the second piezoelectric plate 3, thus defining the second transit capacitor unit 8.

Similarly, in the above-described first piezoelectric substrate 2, a capacitor electrode (not shown) is disposed on the bottom surface thereof so as to oppose the capacitor electrode 5a.

The first and the second piezoelectric substrates 2 and 3 are laminated with an adhesive sheet 9 therebetween, which is preferably composed of a thermosetting adhesive that is cured in advance. The adhesive sheet 9 has a through hole 9a at the approximate center thereof which provides a sufficient space for the piezoelectric filter units 4 and 7 to freely vibrate therein.

In addition, the adhesive sheet 9 is provided with notches 9b to 9d and 9e to 9g at opposing sides thereof, each of which has a substantially semicircular shape as seen from the top.

The notches 9b to 9d and 9e to 9g are arranged by forming substantially circular through holes in a large adhesive sheet, and by cutting the large adhesive sheet.

Adhesive sheets 10 and 11 are laminated on the outwardly facing surfaces of the piezoelectric substrates 2 and 3, respectively. The adhesive sheets 10 and 11 are preferably formed of the same material as the material from which the adhesive sheet 9 is formed, and have through holes 10a and 11a, respectively, which provide sufficient spaces for the piezoelectric filter units 4 and 7 to freely vibrate therein.

It is not necessary to form the adhesive sheets 10 and 11 with the same material as the material from which the adhesive sheet 9 is formed. The adhesive sheets 10 and 11 may also be formed by, for example, applying an adequate insulating adhesive in the shape of a substantially rectangular frame as shown in FIG. 1.

Case substrates 12 and 13 are laminated on the outwardly facing surfaces of the adhesive sheets 10 and 11, respectively. Each of the case substrates 12 and 13 is provided with a concavity 13a on the inwardly facing surface thereof. Accordingly, sufficient spaces for the piezoelectric filter units 4 and 7 to freely vibrate therein are provided.

In the present preferred embodiment, the case substrates 12 and 13 are preferably constructed of an insulating ceramic such as alumina, or other suitable material. The case substrates 12 and 13, however, may also be constructed of another adequate insulating material such as a synthetic resin, or other suitable material.

A plurality of external electrodes are arranged so as to extend vertically on the side surfaces of the laminate including the above-described components. The external electrodes are preferably formed by a thin film forming method such as sputtering, deposition, plating, or other suitable method, or by applying a conductive paste.

The present preferred embodiment is characterized in that the elasticity modulus of the adhesive sheet 9 is in the range of about 0.5 MPa to about 3000 MPa, and in that the material from which the external electrodes are formed is inserted into the above-described notches 9b to 9d and 9e to 9g.

Figure 5:
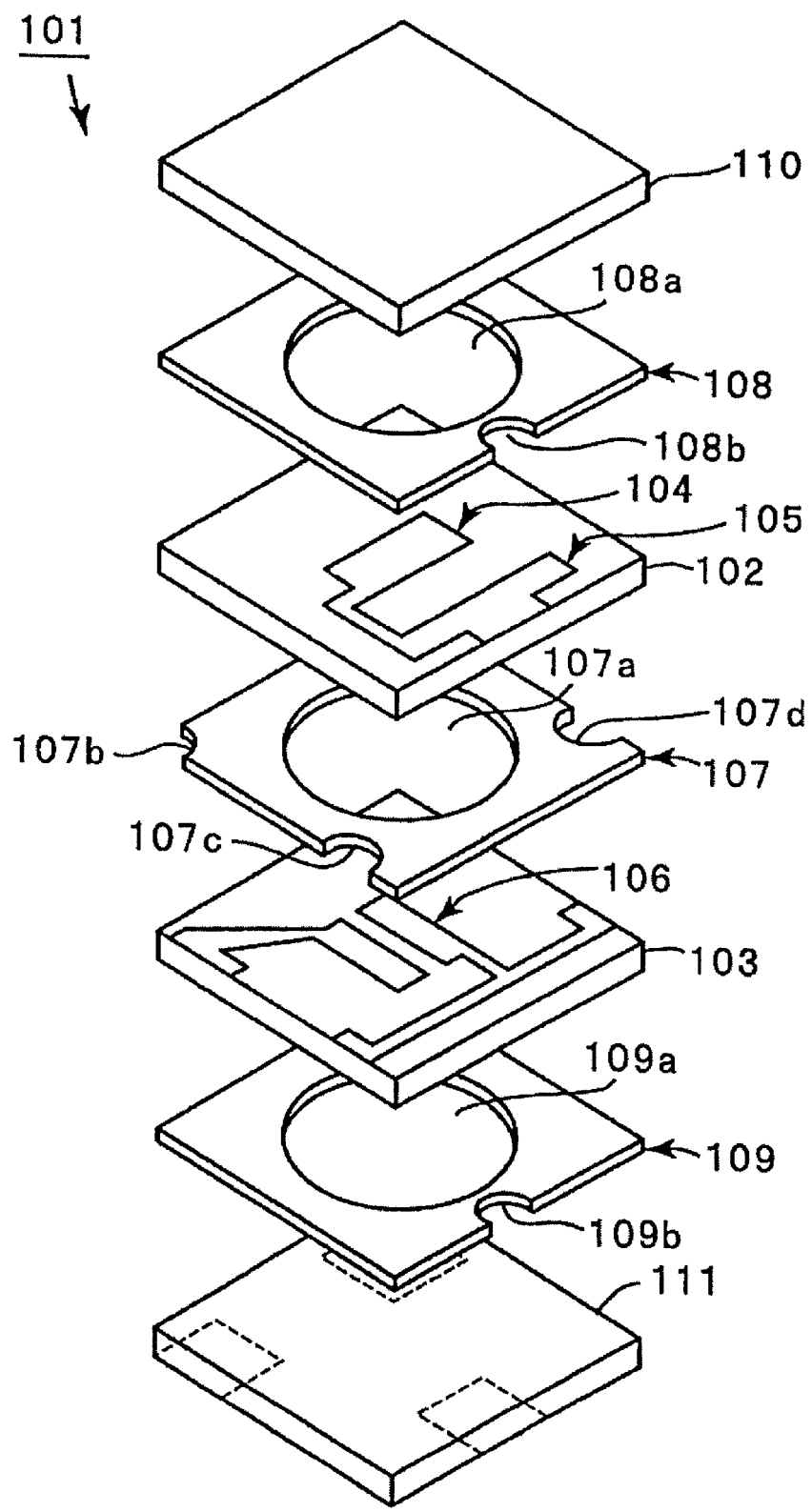
FIG. 5 is an exploded perspective view of a conventional piezoelectric filter.

In the conventional chip-type piezoelectric filter, the modulus of elasticity of the adhesive layer used for adhering the piezoelectric substrates is relatively high. Therefore, it is necessary to make the adhesive layer thick. When the modulus of elasticity of the adhesive layer is reduced, the adhesion strength between the side surfaces of the adhesive layer and the external electrodes will be weakened, so that the external electrodes will be separated therefrom. Thus, the reliability of electrical connections between the side surfaces of the adhesive layer and the external electrodes will be degraded. Accordingly, in the conventional piezoelectric filter, the adhesive layer for adhering the piezoelectric substrates, that is, the spacer 107 shown in FIG. 5, is constructed of an adhesive of which the elasticity modulus is extremely high, such as 5000 MPa. When such an adhesive with a high elasticity modulus is used, however, undesired spurious responses cannot be suppressed unless the thickness of the adhesive layer is increased.

In contrast, in the chip-type piezoelectric filter 1 of the present preferred embodiment, the adhesive sheet 9 has a relatively low elasticity modulus, as described above, so that undesired spurious responses are effectively suppressed and minimized even when the adhesive sheet 9 is thin. As described above, when the elasticity modulus of the adhesive sheet 9 is low, there is a risk of the reliability of the electrical connections between the side surfaces of the adhesive sheet 9 and the external electrodes becoming degraded. In the present preferred embodiment, however, the notches 9b to 9d and 9e to 9g are formed in the adhesive sheet 9, so that the reliability of the electrical connection is greatly increased.

More specifically, the conductive material from which the external electrodes are formed is inserted into the notches 9b to 9d and 9e to 9g, so that the adhesion strength between the external electrodes and the side surfaces of the adhesive sheet 9 is greatly increased. FIG. 2 is a longitudinal sectional view of the piezoelectric filter 1 shown in FIG. 1, which is cut along a plane corresponding to line A—A. As is apparent from FIG. 2, the notches 9d and 9g are filled with the external electrodes 14 and 15, respectively. Accordingly, the connection areas of the side surfaces of the adhesive sheet 9 and the external electrodes 14 and 15 are greatly increased. Thus, the external electrodes 14 and 15 do not separate from the side surfaces of the adhesive sheet 9.

In the present preferred embodiment, the piezoelectric substrates 2 and 3 are laminated with the adhesive sheet 9 therebetween, which has a small elasticity modulus. Accordingly, even when the thickness of the adhesive sheet 9 is reduced, undesired spurious responses are effectively suppressed. In addition, since the notches 9b to 9d and 9e to 9g are formed, the reliability of the electrical connection between the external electrodes and the side surfaces of the adhesive sheet 9 is greatly increased.

The effects of the present preferred embodiment will be described below in conjunction with an experimental example.

Substantially rectangular substrates constructed of PZT and having approximate dimensions of 20 mm×30 mm×thickness 0.2 mm were prepared as the piezoelectric substrates 2 and 3. Then, conductive films constructed of Ag were formed on the top and the bottom surfaces of the piezoelectric substrates, and patterns of the resonance electrodes 4a, 4b, and 7a, the capacitor electrodes 5a and 8a, etc., were formed by photolithography processing. Various types of piezoelectric filters 1 having adhesive sheets 9 with different elasticity moduli after curing and thicknesses were prepared.

Figure 3:
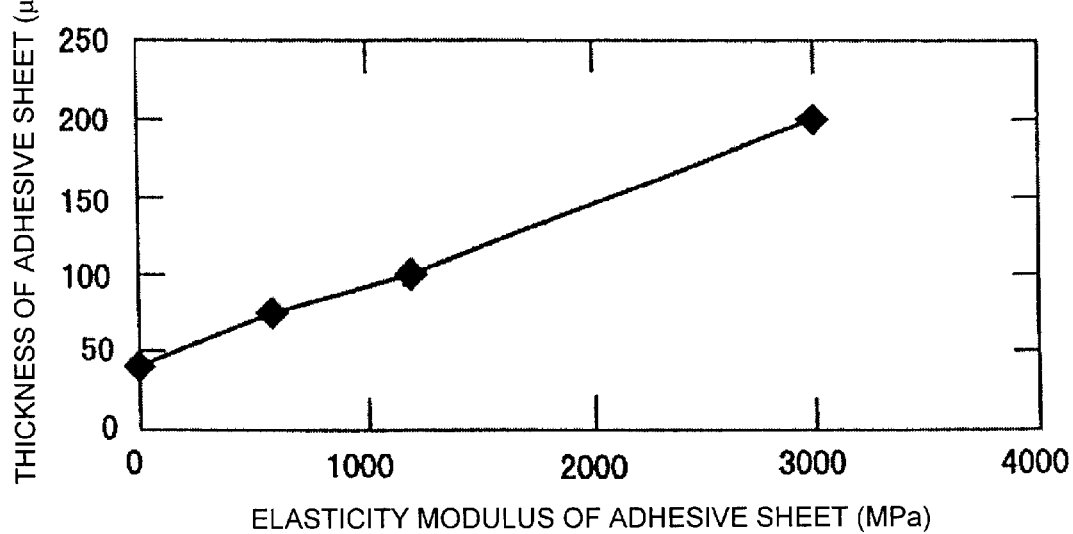
FIG. 3 is a graph that shows the relationship between the modulus of elasticity and the thickness of an adhesive sheet, under a condition in which spurious responses are sufficiently suppressed.

With respect to piezoelectric filters that showed a spurious-response suppressing effect that was equivalent to that in the conventional type, the relationship between elasticity modulus and thickness of the adhesive sheet is shown in FIG. 3. In this example, the spurious-response suppressing effect which was equivalent to that in the conventional type was determined as follows. First, a piezoelectric filter having an adhesive sheet of which the elasticity modulus was about 3000 MPa and the thickness was about 300 µm was used for measuring spurious response X which appears in the filter characteristic. Then, when the measured spurious was within X±1%, the spurious-response suppressing effect was determined to be equivalent to that in the conventional type.

As is apparent from FIG. 3, by reducing the elasticity modulus thereof, a sufficient spurious-response suppressing effect can be obtained even when the adhesive sheet 9 is thin.

For example, although the adhesive sheet was required to be about 200 µm thick in the conventional type, the thickness of the adhesive sheet may be reduced to about 40 µm by reducing the elasticity modulus to about 2 MPa. In addition, when the adhesive sheet of which the elasticity modulus is about 600 MPa is used, the thickness thereof may be reduced to about 75 µm. In addition, when the adhesive sheet of which the elasticity modulus is about 1200 MPa is used, the thickness thereof may be reduced to about 100 µm.

Accordingly, it is understood that the thickness of the adhesive sheet 9 may be reduced by reducing the elasticity modulus thereof.

When the elasticity modulus exceeds approximately 3000 MPa, the thickness of the adhesive sheet has to be about 200 µm or more, so that the thickness which is equivalent to that in the conventional type is required. Thus, according to preferred embodiments of the present invention, the upper limit of the elasticity modulus is approximately 3000 MPa.

Figure 4:
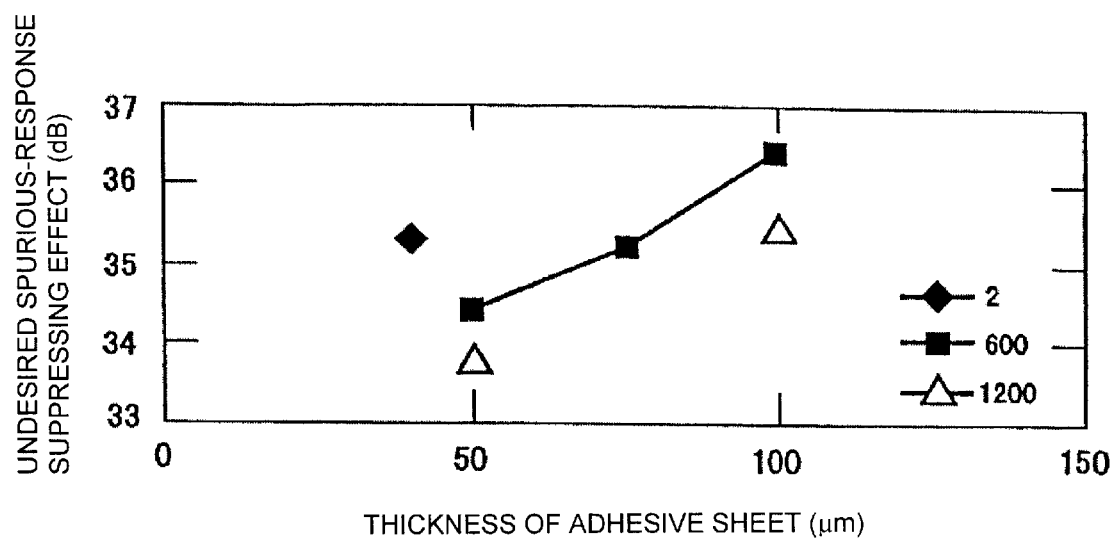
FIG. 4 is a graph which shows the relationship between the thickness of the adhesive sheet and the suppression of spurious responses.

FIG. 4 and Table 1 show the undesired spurious-response suppressing effect of the various types of piezoelectric filters, which have adhesive sheets 9 of which the elasticity moduli and the thicknesses are different. In FIG. 4, the vertical axis shows the undesired spurious-response suppressing effect, which is indicated by an amplitude of spurious which appears in the filter characteristic.

TABLE 1

|  |  | Elasticity modulus of adhesive sheet (MPa) | | |
|---|---|---|---|---|
|  |  | 2 | 600 | 1200 |
| Thickness of adhesive sheet (µm) | 40 | 35.3 |  |  |
|  | 50 |  | 34.4 | 33.8 |
|  | 75 |  | 35.2 |  |
|  | 100 |  | 36.4 | 35.5 |

As is apparent from Table 1, in the case in which the elasticity modulus of the adhesive sheet 9 is constant, the undesired spurious-response suppressing effect is improved by increasing the thickness thereof. On the other hand, in the case in which the thickness of the adhesive sheet 9 is constant, the undesired spurious-response suppressing effect is greatly improved when the elasticity modulus thereof is reduced.

Accordingly, the lower the elasticity modulus of the adhesive sheet 9, the further the thickness thereof may be reduced. In addition, even in such a case, the undesired spurious responses are still effectively suppressed and minimized. When the elasticity modulus of the adhesive sheet 9 is excessively reduced, however, the mechanical strength and the adhesion strength thereof will also be reduced, so that the quality of the piezoelectric filter 1 as a product will be degraded. Thus, the elasticity modulus of the adhesive sheet 9 is required to be higher than about 0.5 MPa.

Preferably, the elasticity modulus of the adhesive sheet 9 is in the range of about 0.5 to about 1500 MPa in order to effectively suppress the undesired spurious responses and to reduce the thickness of the adhesive sheet 9.

In the above-described preferred embodiments, the adhesive sheet 9 is preferably formed in advanced, and is preferably constructed of a thermosetting adhesive sheet, which is cured by heat.

The present invention, however, is not limited to this, and a thermosetting adhesive may also be used instead of the adhesive sheet 9. Also, in a case in which the thermosetting adhesive, of which the elasticity modulus after being cured by heat is in the range of about 0.5 MPa to about 3000 MPa, is used, the thickness of the adhesive may be much less, and the effects similar to the above-described effects may be obtained.

From the viewpoint of convenience, however, the adhesive sheet which is formed in advance as described above is preferably used. More preferably, a thermosetting adhesive sheet which is not adhesive at room temperature, which becomes adhesive when heat is applied, and which does not have fluidity, is used as the above-described adhesive sheet.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A piezoelectric filter comprising:
   a first piezoelectric substrate including a first piezoelectric filter unit and a first transfer capacitor unit;
   a second piezoelectric substrate including a second piezoelectric filter unit and a second transfer capacitor unit;
   an adhesive layer having a thickness between about 60 µm and about 200 µm and disposed between the first and the second piezoelectric substrates so that a laminate including the first and the second piezoelectric substrates and said adhesive layer is defined; and
   a plurality of external electrodes disposed on the outwardly facing surfaces of said laminate;
   wherein the modulus of elasticity of said adhesive layer is in the range of about 0.5 MPa to about 3000 MPa, said adhesive layer having at least one notch at the edge, and a material from which the external electrodes are formed is disposed into said at least one notch.

2. A piezoelectric filter according to claim 1, wherein said adhesive layer includes a through hole formed therein which is arranged to provide a sufficient space for the first and the second piezoelectric filter units to freely vibrate therein.

3. A piezoelectric filter according to claim 1, wherein said adhesive layer is made of a thermosetting adhesive sheet which is formed in advance.

4. A piezoelectric filter according to claim 1, wherein said at least one notch is filled with the material from which the external electrodes are formed.

5. A piezoelectric filter according to claim 1, wherein the first piezoelectric substrate and the second piezoelectric substrate are made of one of a piezoelectric ceramic and a piezoelectric single crystal.

6. A piezoelectric filter according to claim 1, wherein the adhesive sheet has a plurality of notches at opposing side edges thereof.

7. A piezoelectric filter according to claim 6, wherein each of the plurality of notches has a substantially semicircular shape.

8. A piezoelectric filter according to claim 1, further comprising additional adhesive sheets laminated on outwardly facing surfaces of the first and second piezoelectric substrates.

9. A piezoelectric filter according to claim 8, wherein the additional adhesive sheets are made of the same material as the material from which the adhesive sheet disposed between the first and the second piezoelectric substrates is formed.

10. A piezoelectric filter according to claim 8, wherein the additional adhesive sheets have Through holes disposed therein and are arranged to provide sufficient spaces for the piezoelectric filter units to freely vibrate therein.

11. A method of manufacturing a piezoelectric filter, comprising the steps of:

preparing a first piezoelectric substrate, which includes a first piezoelectric filter unit and a first transfer capacitor unit, and a second piezoelectric substrate, which includes a second piezoelectric filter unit and a second transfer capacitor unit;

forming a laminate by laminating the first and the second piezoelectric substrates with an adhesive formed therebetween, said adhesive having a thickness between about 60 $\mu$m and about 200 $\mu$m; and forming a plurality of external electrodes on the outwardly facing surfaces of said laminate;

wherein the modulus of elasticity of said adhesive after being cured is in the range of about 0.5 MPa to about 3000 MPa, said adhesive which is disposed between the first and the second piezoelectric substrates is provided with at least one notch at an edge thereof, and the external electrodes are formed in a manner such that a material from which the external electrodes are formed is inserted into said at least one notch.

12. A method according to claim 11, wherein a thermosetting adhesive sheet which is formed in advance, and which is cured by heat, is used as said adhesive.

13. A method according to claim 11, wherein said thermosetting adhesive sheet is not adhesive at room temperature and becomes adhesive when heat is applied in an adhering process, and does not have fluidity.

14. A method according to claim 11, wherein said adhesive includes a through hole which provides a sufficient space for the first and the second piezoelectric filter units to freely vibrate therein.

15. A method according to claim 11, wherein the first piezoelectric substrate and the second piezoelectric substrate are made of one of a piezoelectric ceramic and a piezoelectric single crystal.

16. A method according to claim 11, wherein the adhesive sheet has a plurality of notches at opposing side edges thereof.

17. A method according to claim 16, wherein each of the plurality of notches has a substantially semicircular shape.

18. A method according to claim 11, further comprising the step of forming additional adhesive sheets laminated on outwardly facing surfaces of the first and second piezoelectric substrates.

19. A method according to claim 18, wherein the additional adhesive sheets are made of the same material as the material from which the adhesive sheet disposed between the first and the second piezoelectric substrates is formed.

20. A method according to claim 18, wherein the additional adhesive sheets have through holes disposed therein and are arranged to provide sufficient spaces for the piezoelectric filter units to freely vibrate therein.

* * * * *